(12) United States Patent
Michal et al.

(10) Patent No.: US 10,788,523 B1
(45) Date of Patent: Sep. 29, 2020

(54) INDUCTOR VALUE DETERMINATION FOR POWER CONVERTER

(71) Applicant: Infineon Technologies AG, Neubiberg (DE)

(72) Inventors: Vratislav Michal, Villach (AT); Nicolo Zilio, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/441,787

(22) Filed: Jun. 14, 2019

(51) Int. Cl.
*H02M 3/158* (2006.01)
*G01R 27/26* (2006.01)
*H02M 1/00* (2006.01)

(52) U.S. Cl.
CPC ....... *G01R 27/2611* (2013.01); *H02M 3/1582* (2013.01); *H02M 3/158* (2013.01); *H02M 3/1588* (2013.01); *H02M 2001/0009* (2013.01)

(58) Field of Classification Search
CPC . H02M 3/158; H02M 3/15582; H02M 3/1588
USPC .......................... 323/266, 274, 283–285, 299
See application file for complete search history.

(56) References Cited

U.S. PATENT DOCUMENTS

| | | | | |
|---|---|---|---|---|
| 7,295,452 B1* | 11/2007 | Liu | ............................ | G05F 1/70 323/235 |
| 8,076,919 B2* | 12/2011 | Liu | ..................... | H02M 1/4225 323/222 |
| 8,120,346 B2* | 2/2012 | Ostrom | ................. | H02M 3/156 323/272 |
| 8,164,319 B2* | 4/2012 | Bodano | ................. | H02M 3/156 323/284 |
| 8,508,195 B2* | 8/2013 | Uno | ..................... | H02M 1/4225 323/210 |
| 8,823,346 B2* | 9/2014 | Walters | ............... | H02M 1/4225 323/266 |
| 9,912,238 B1* | 3/2018 | Pazhayaveetil | ........ | H03G 3/004 |
| 2011/0241642 A1* | 10/2011 | Xi | ....................... | H02M 3/1588 323/285 |
| 2014/0077790 A1* | 3/2014 | Sohma | ................ | H02M 3/1588 323/313 |
| 2015/0349636 A1* | 12/2015 | Bodano | ................. | H02M 3/158 323/271 |
| 2016/0006336 A1* | 1/2016 | Bennett | .................... | H02M 1/00 323/271 |
| 2017/0179816 A1* | 6/2017 | Michal | .................... | H02M 3/04 |
| 2018/0152103 A1* | 5/2018 | Mansri | ................. | H02M 3/156 |

* cited by examiner

*Primary Examiner* — Gary A Nash

(74) *Attorney, Agent, or Firm* — Schiff Hardin LLP

(57) ABSTRACT

A circuit having a power converter configured to convert an input voltage to an output voltage; a controller having an inner loop configured to regulate a peak inductor current of an inductor of the power converter to a reference peak inductor current value; and an inductor value measurement circuit configured to determine a value of the inductor based on the output voltage of the power converter and the reference peak inductor current value.

20 Claims, 4 Drawing Sheets

V versus L Graph

INDUCTOR VALUE DETERMINATION FOR POWER CONVERTER

BACKGROUND

An inductor value of a power converter may be determined by estimating using a model observer, identifying parameters online, or injecting small signals. Each of these methods requires significant analog signal processing infrastructure, which is not compatible with industrial applications.

DETAILED DESCRIPTION

The present disclosure is directed to determining an inductor value of a power converter. The determination is based on an inherent property of an inner loop of a controller, where a power converter output voltage versus reference peak inductor current transfer function is heavily dependent on the inductor value.

Figure 1:
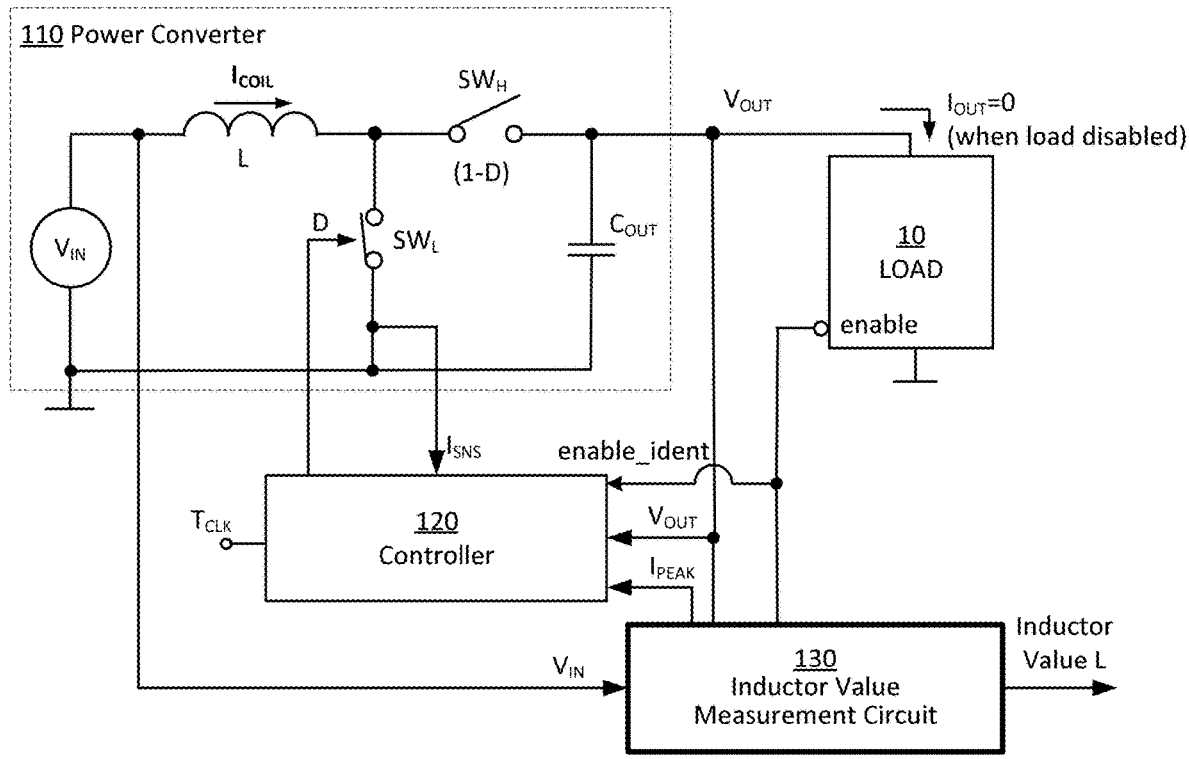
FIG. 1 illustrates a circuit in accordance with the disclosure.

FIG. 1 illustrates a circuit 100 in accordance with the disclosure.

The circuit 100 comprises a power converter 110, a controller 120, and an inductor value measurement circuit 130, each of which is connected to a load 10.

The power converter 110 is configured to convert an input voltage $V_{IN}$ to an output voltage $V_{OUT}$. The input voltage $V_{IN}$ and the output voltage $V_{OUT}$ may have the same or different levels. The power converter 110 may be any type of power converter—a Direct Current to Direct Current converter (DC/DC), a DC to Alternating Current converter (DC/AC), an AC/DC converter, an AC/AC converter, or the like. In the case of a DC/DC converter, the power converter 110 may be any type of DC/DC converter—a boost converter, a buck converter, a buck-boost converter, or the like. The power converter 110 shown is a boost converter which has an inductor L. Boost converters are known, and for the sake of brevity, its detailed description is omitted here.

The controller 120 has an inner loop configured to regulate a peak value of the inductor current $I_{COIL}$ of the inductor L to a reference peak inductor current value $I_{PEAK}$. (The inner loop is described below with respect to FIGS. 4 and 6.) The controller 120 may be an analog Current Mode Controller (CMC), a digital CMC, a Voltage Mode Controller (VMC), a VMC that is tuned, a Sliding Mode Controller (SMC), or the like. Basically, the controller 120 may be any type of current mode controller or a different controller that uses an inductor value L to tune itself for better performance.

The inductor value measurement circuit 130 is configured to determine the inductor value L once during start-up of the circuit 100 with a nearly zero load current ($I_{OUT}=0$) or when the load current is sufficiency low to have an insignificant impact on the determination of the inductor value L. Typically, a nearly zero load current $I_{OUT}$ can be obtained by disabling or disconnecting the load 10. This condition ensures a zero average DC inductor current ($I_{COIL\_DC}=0$). The inductor value determination does not perturb the circuit 100 or output voltage $V_{OUT}$ during normal operation. The determined inductor value L can be stored in a memory, such as a One Time Programmable (OTP) memory.

The inductor value measurement circuit 130 may be analog or digital. Also, the inductor value measurement circuit 130 may comprise an analog-to-digital converter and a digital circuit configured to determine the inductor value L.

The inductor value measurement circuit 130 is configured to determine a value of the inductor L based on the output voltage $V_{OUT}$ of the power converter 110 and the reference peak inductor current value $I_{PEAK}$. During steady-state, a relationship between the output voltage $V_{OUT}$, reference peak inductor current $I_{PEAK}$, and the inductor value L can be established.

The inductor value measurement circuit 130 and the controller 120 may be separate circuits. Alternatively, the inductor value measurement circuit 130 may form part of the controller 120. Alternatively, the controller 120 may form part of the inductor value measurement circuit 130.

Figure 2:
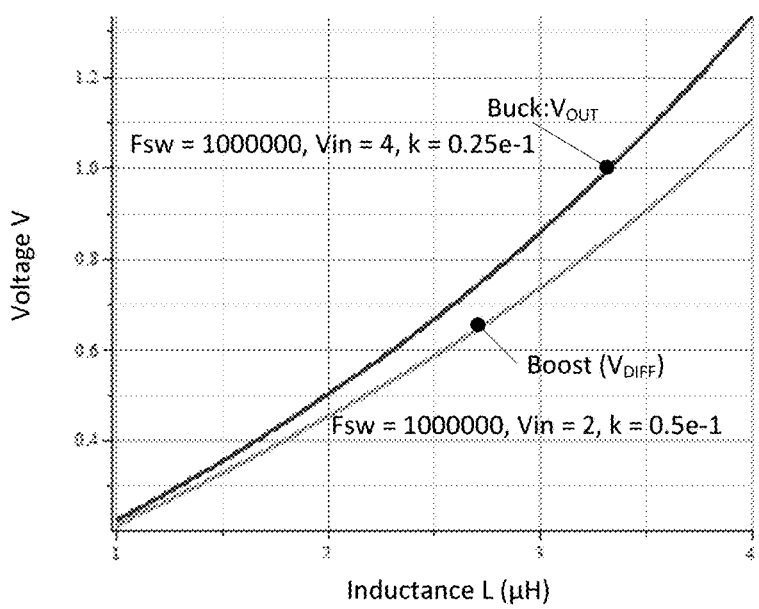
FIG. 2 illustrates a voltage versus inductance graph.

FIG. 2 illustrates an output voltage $V_{OUT}$ versus inductance L graph 200. For a given switching frequency $F_{SW}$, the output voltage $V_{OUT}$ of a buck and boost converter depends heavily on the inductance L. The reference peak inductor current $I_{PEAK}$ is a fixed value. Knowing the relationship between the output voltage $V_{OUT}$, the reference peak inductor current $I_{PEAK}$, and the inductor value L results in an accurate determination of the inductor value L, as will be described in more detail below with reference to the circuits of FIGS. 4 and 6.

Figure 3:
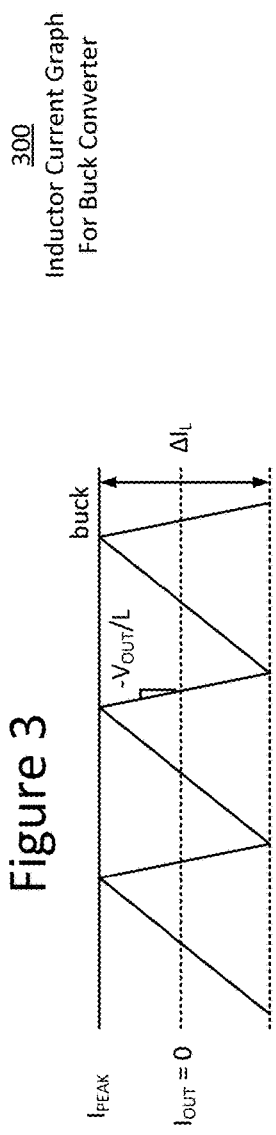
FIG. 3 illustrates an inductor current graph for a buck converter.

FIG. 3 illustrates an inductor current graph 300 for a buck converter. This graph 300 shows that during steady-state, the power (buck) converter 410 with zero output current ($I_{OUT}=0$) generates an inductor current $I_{COIL}$ of a triangular shape with a zero, or nearly zero, DC component ($I_{COIL\_DC}=0$) and a reference peak inductor current $I_{PEAK}$.

Figure 4:
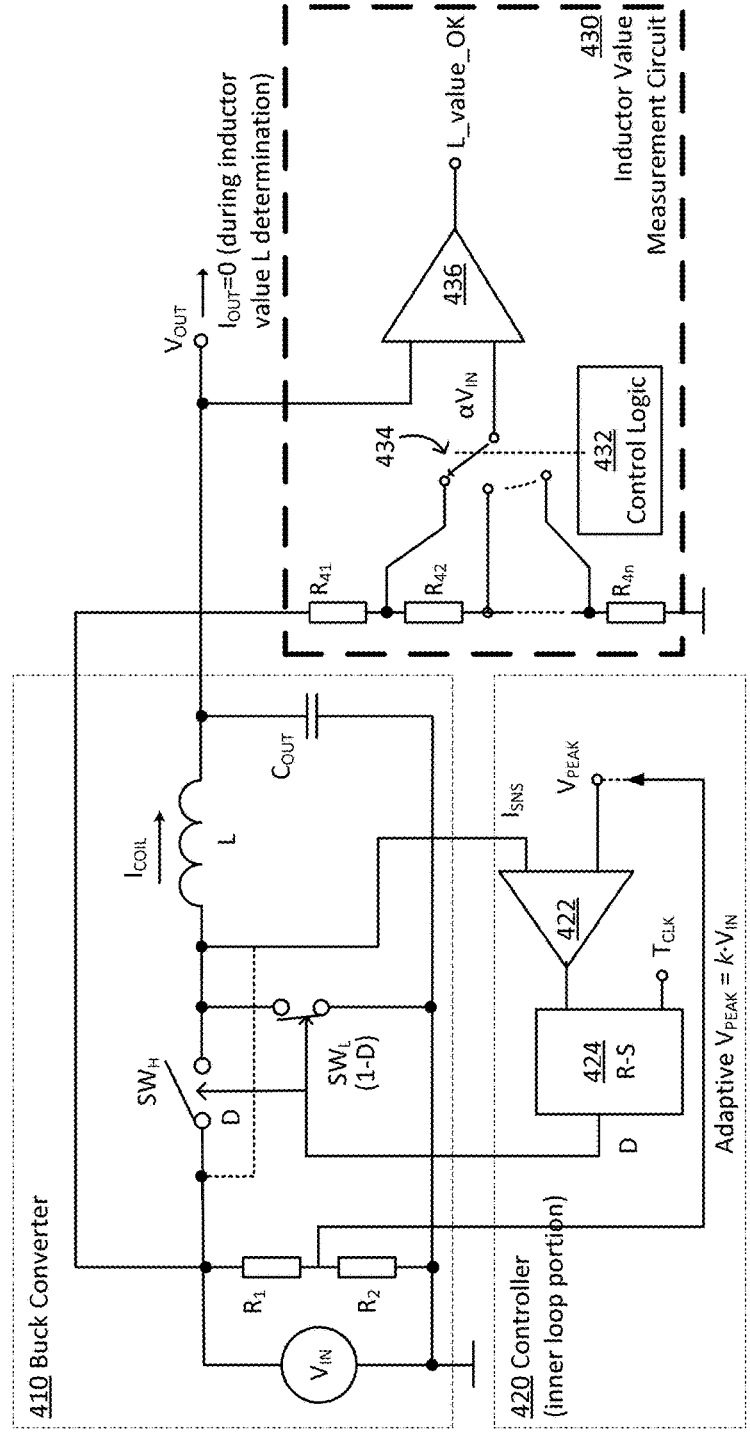
FIG. 4 illustrates a circuit, which has a buck converter, in accordance with the disclosure.

FIG. 4 illustrates a circuit 400 in accordance with the disclosure.

The circuit 400 comprises a buck converter 410, a controller 420, and an inductor value measurement circuit 430. The circuit 400 is a detailed example of the more generic circuit 100 of FIG. 1, though circuit 400 happens to have a buck converter 410 rather than a boost converter.

The buck converter 410 is known. For the sake of brevity, a detailed description is omitted here.

The controller 420 shows the inner loop; the outer loop is not shown as it may not be needed for the inductor value measurement. The inner loop comprises a comparator 422 and a flip-flop circuit 424. The inner loop is configured to regulate a peak value of the inductor current $I_{SNS}$ (or $I_{COIL}$) of the inductor L to a reference peak inductor current value $I_{PEAK}$ based on a reference peak voltage $V_{PEAK}$. The resistive divider R1-R2 provides the reference peak voltage $V_{PEAK}$. The comparator 422 compares the inductor current $I_{SNS}$ with the reference peak voltage $V_{PEAK}$, and the flip-flop circuit 424 controls a duty cycle D of the low-side switch $SW_L$ of the buck converter 410 based on this comparison.

The inductor value measurement circuit 430 in this example comprises control logic 432, a variable resistive divider, and a comparator 436. The variable resistive divider is formed of a series of resistors $R_{41}, R_{42} \ldots R_{4n}$, which are coupled between the input voltage $V_{IN}$ and ground, and a switch 434. The resistive divider may alternatively be replaced by an analog-to-digital controller or a look-up table.

The control logic 432 outputs control values to control the switch 434 to toggle through the resistor divider, that is, through the contacts between the resistors $R_{41}, R_{42} \ldots R_{4n}$, until the value $\alpha V_{IN}$ is determined by the comparator 436 to be equal to the output voltage $V_{OUT}$. The value of $\alpha$ is known, and then Equation (6) below is used to calculate the inductor value L. The inductor value measurement circuit 430 thus basically compares $V_{OUT}$ with a fraction of $V_{IN}$ using a resistive divider to determine the relationship between the output voltage $V_{OUT}$ and reference peak inductor current $I_{PEAK}$ for the power (buck) convertor 410, as represented using Equations 1-6 as follows.

The amplitude of the inductor ripple current $\Delta I_L$ for buck converter is expressed as:

$$\Delta I_L = \frac{V_{OUT}}{L} \cdot T_{SW_L} \quad \text{(Equation 1)}$$

where $T_{SW}=(1-D)/F_{SW}$ is the conduction time of low-side switch. As the triangular ripple current is symmetrical around $I_{COIL\_DC}=0$, $I_{PEAK}=\Delta I_L/2$. The reference peak inductor current value $I_{PEAK}$ is then written as:

$$I_{PEAK} = \frac{1}{2} \frac{V_{OUT}(1-D)}{L \cdot F_{SW}} \quad \text{(Equation 2)}$$

where for ideal buck-converter $D=V_{OUT}/V_{IN}$. Equation (2) for the reference peak inductor current value $I_{PEAK}$ is then:

$$I_{PEAK} = \frac{1}{2} \frac{V_{OUT}\left(1-\frac{V_{OUT}}{V_{IN}}\right)}{L \cdot F_{SW}} \quad \text{(Equation 3)}$$

Thus, the reference peak inductor current value $I_{PEAK}$, and ultimately the inductor value L, is dependent on the input voltage $V_{IN}$.

While the inner loop ensures regulation of $I_{PEAK}$, the output voltage $V_{OUT}$ for a given reference peak inductor current $I_{PEAK}$ from Equation (3) is:

$$V_{OUT} = \frac{1}{2} V_{IN} - \frac{1}{2}\sqrt{V_{IN}^2 - 8 I_{PEAK} V_{IN} F_{SW} L} \quad \text{(Equation 4)}$$

Equation (4) presents a relationship of the output voltage $V_{OUT}$ and the input voltage $V_{IN}$, switching frequency $F_{SW}$, reference peak inductor current $I_{PEAK}$, and the value of interest, that is, the inductor value L. However, the dependency on the input voltage $V_{IN}$ is not appreciated, as this value needs to be measured.

By setting $I_{PEAK}=k \cdot V_{IN}$ (e.g., $I_{PEAK}=k \cdot V_{IN}$ can be realized, for example, by the resistive divider from the input voltage $V_{IN}$), Equation (4) is transformed to:

$$V_{OUT} = \frac{1}{2} V_{IN} \cdot \left(1 - \sqrt{1 - 8 k F_{SW} L}\right) \quad \text{(Equation 5)}$$

which means that the output voltage $V_{OUT}$ is linearly dependent on the input voltage $V_{IN}$. Comparing the output voltage $V_{OUT}$ with a-scaled input voltage (e.g., $\alpha V_{IN}$ can be realized by the programmable resistive divider), the value of the inductor L is obtained, independently on the input voltage $V_{IN}$. When $V_{OUT}=\alpha V_{IN}$ is detected by the comparator 436, the inductor value L is obtained by:

$$L = \frac{1}{2} \frac{\alpha(1-\alpha)}{k \cdot F_{SW}} \quad \text{(Equation 6)}$$

In summary, the inductor value L is determined by first running the inner loop for $I_{OUT} \approx 0$ for a given $I_{PEAK}=k \cdot V_{IN}$. The reference peak inductor current $I_{PEAK}$ then ramps up to provide "soft-start feature." While steady-state is obtained, the control logic 432 toggles the switch 434 until the comparator 436 determines that the scaled input voltage $\alpha V_{IN}$ is equal to the output voltage $V_{OUT}$. The identification is then stopped, and the inductor value L is known from the position of the switch 434.

The value of reference peak inductor current $I_{PEAK}$ should be chosen so that, for the lowest possible ripple (i.e., the inductance is maximum and the output voltage $V_{OUT}$ is a minimum), the duty-cycle remains below 0.5. This condition avoids the inner-loop feedback requiring ramp-compensation.

Figure 5:
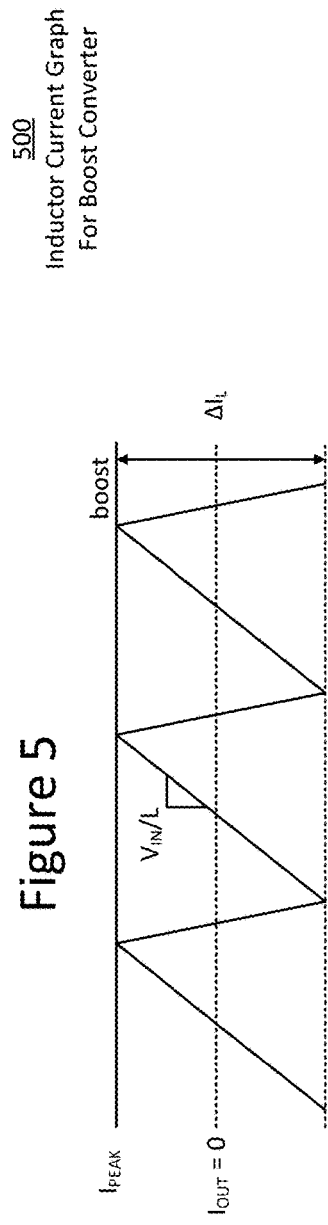
FIG. 5 illustrates an inductor current graph for a boost converter.

FIG. 5 illustrates an inductor current graph 500 for a boost converter. The graph 500 shows that in the steady-state, a free-running boost converter with zero output current ($I_{OUT}=0$) generates inductor current $I_{COIL}$ of a triangular shape and a reference peak inductor current $I_{PEAK}$.

Figure 6:
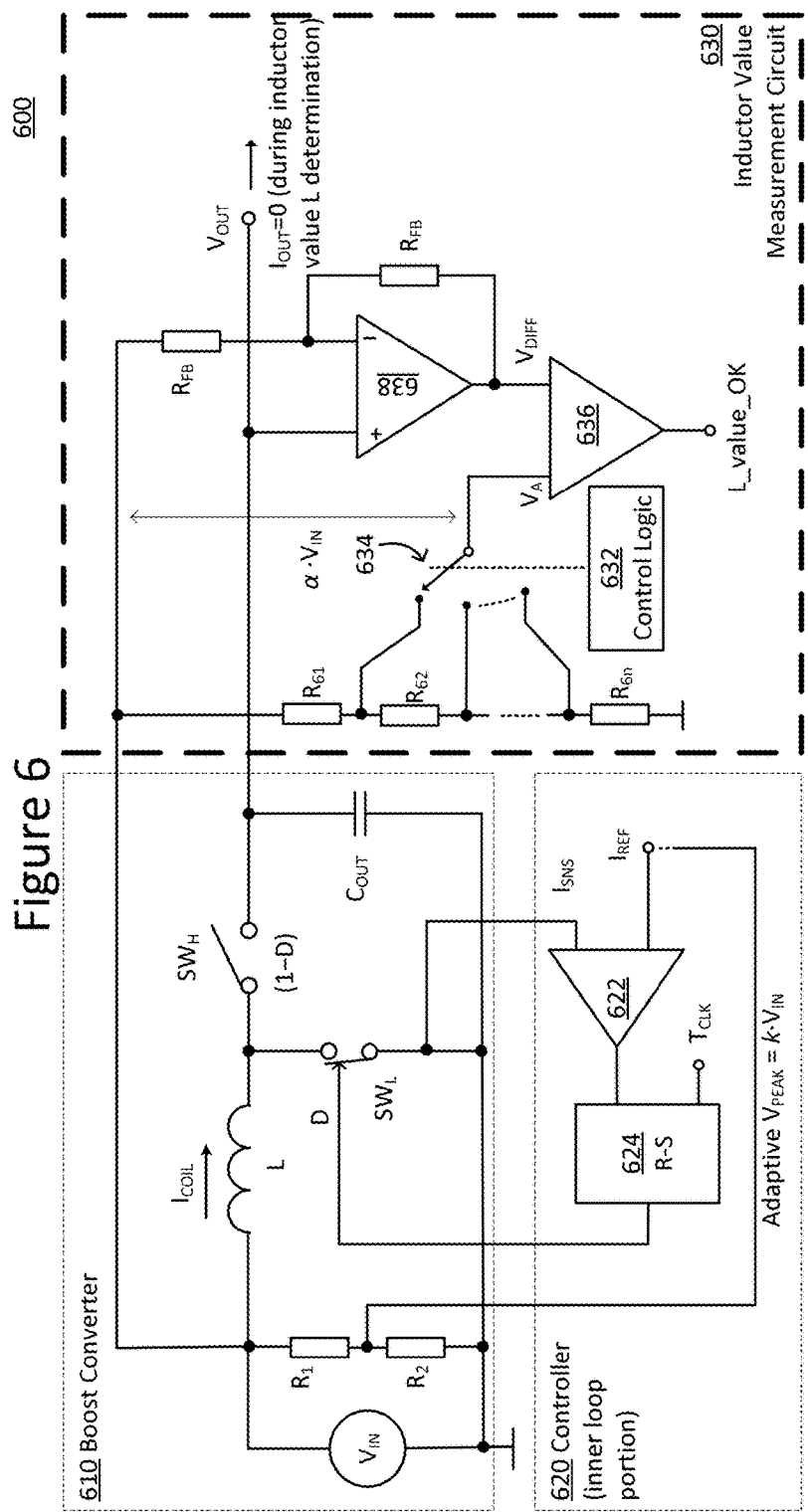
FIG. 6 illustrates a circuit, which has a boost converter, in accordance with the disclosure.

FIG. 6 illustrates a circuit 600 in accordance with the disclosure.

The circuit 600 comprises a boost converter 610, a controller 620, and an inductor value measurement circuit 630. The circuit 600 is a more detailed example of the more generic circuit 100 of FIG. 1, and differs from the circuit 400 of FIG. 4 primarily in that it has a boost converter 610 rather than a buck converter 410.

The boost converter 610 is known. For the sake of brevity, a detailed description is omitted here.

The controller 620 shows the inner loop; the outer loop is not shown. The inner loop is the same as the inner loop 420 discussed above with respect to FIG. 4.

The inductor value measurement circuit 630 in this example comprises control logic 632, a variable resistive divider, a comparator 636, and a differential inverting amplifier 638. The variable resistive divider is formed of a series of resistors $R_{61}, R_{62} \ldots R_{6n}$, which are coupled between the input voltage $V_{IN}$ and ground, and switch 634. The resistive divider provides the reference peak inductor current $I_{PEAK}$. The resistive divider may alternatively be replaced by an analog-to-digital controller or a look-up table.

The differential inverting amplifier 638 is configured to determine a difference between the input voltage $V_{IN}$ and the output voltage $V_{OUT}$ with a unity gain resulting in a difference voltage $V_{DIFF}$. The remaining portion of the inductor value measurement circuit 630 is basically the same as the inductor value measurement circuit 430 of FIG. 4, except different values are compared by the comparator 636.

The control logic 632 outputs control values to control the switch 634 to toggle through the resistive divider, that is, through the contacts between the resistors $R_{61}$, $R_{62}$ ... $R_{6n}$, until the value $V_A$, which equals $V_{IN}-\alpha V_{IN}$, is determined by the comparator 436 to be equal to the difference voltage $V_{DIFF}$. The value of α is known, and then Equation (14) below is used to calculate the inductor value L. The inductor value measurement circuit 630 thus basically compares $V_{OUT}$ with a fraction of $V_{DIFF}/\alpha V_{in}$ using a resistive divider to determine the relationship between the output voltage $V_{OUT}$ and reference peak inductor current $I_{PEAK}$ for the power (boost) convertor 610, as represented using Equations 7-14 as follows.

The amplitude of the inductor ripple current $\Delta I_L$ is expressed as:

$$\Delta I_L = \frac{V_{IN}}{L} \cdot T_{SW_L} \quad \text{(Equation 7)}$$

where $T_{SW\_L}=D/F_{SW}$. As the triangular ripple current $\Delta I_L$ is symmetrical around $I_{COIL\_DC}=0 \rightarrow I_{PEAK}=\Delta I_L/2$. The reference peak inductor current $I_{PEAK}$ is then written as:

$$I_{PEAK} = \frac{1}{2}\frac{V_{IN}D}{LF_{SW}} \quad \text{(Equation 8)}$$

where for ideal boost-converter $$V_{OUT} = \frac{V_{IN}}{1-D} \rightarrow D = 1 - \frac{V_{IN}}{V_{OUT}}. \quad \text{(Equation 9)}$$

Equation (8) for $I_{PEAK}$ is then developed as:

$$I_{PEAK} = \frac{1}{2}\frac{V_{IN}\left(1-\frac{V_{IN}}{V_{OUT}}\right)}{F_{SW}L} \quad \text{(Equation 10)}$$

Again, the reference peak inductor current value $I_{PEAK}$, and ultimately the inductor value L, is dependent on the input voltage $V_{IN}$.

By solving for the output voltage $V_{OUT}$:

$$V_{OUT} = \frac{V_{IN}^2}{V_{IN} - 2I_{PEAK}F_{SW}L} \quad \text{(Equation 11)}$$

This Equation (11) presents a relationship of the output voltage $V_{OUT}$ to the input voltage $V_{IN}$, the switching frequency $F_{SW}$, the reference peak inductor current $I_{PEAK}$ and the inductor value L of interest. Unlike the buck converter 410, the output voltage $V_{OUT}$ of the boost converter 610 has a high dependency on the input voltage $V_{IN}$. This dependency is decreased by measuring the voltage difference $V_{DIFF}=V_{OUT}-V_{IN}$:

$$V_{DIFF} = \frac{V_{IN}^2}{V_{IN} - 2I_{PEAK}LF_{SW}} - V_{IN} \quad \text{(Equation 12)}$$

Similarly to the output voltage $V_{OUT}$ of the buck converter 410, the dependency on the difference voltage $V_{DIFF}$ versus the input voltage $V_{IN}$ for the boost converter 610 is rather small, but not appreciated. So, by setting $I_{PEAK}=k \cdot V_{IN}$ (e.g., $I_{PEAK}=k \cdot V_{IN}$ is realized by the resistive divider), the Equation (12) is transformed to:

$$V_{diff} = \frac{2kLF_{SW}}{1 - 2kLF_{SW}}V_{IN} \quad \text{(Equation 13)}$$

which means that difference voltage $V_{DIFF}$ is linearly dependent on the input voltage $V_{IN}$. Comparing the difference voltage $V_{DIFF}$ with the a-scaled input voltage ($\alpha V_{IN}$ is realized by a programmable resistive divider), the value of the inductor L is obtained, independently based on the input voltage $V_{IN}$. When condition $V_{OUT}=V_A$ is detected by the comparator 636, the inductor value L is obtained by:

$$L = \frac{1}{2}\frac{\alpha}{k \cdot F_{SW}(1+\alpha)} \quad \text{(Equation 14)}$$

Comparing the difference voltage $V_{DIFF}$ with the scaled input voltage (e.g., $V_A$ can be realized by a programmable resistive divider, A/D converter, etc.), the value of the inductor L can be obtained independently based on the input voltage $V_{IN}$. In FIG. 6, $V_{DIFF}=V_{OUT}-V_{IN}$ is realized by the differential inverting amplifier 638 having a negative unity gain. The scaled input voltage $\alpha V_{IN}$ is not referred to ground, but to the input voltage $V_{IN}$. This means that $V_A=V_{IN}-\alpha V_{IN}$, where in the example of FIG. 6, $\alpha=R_1/\Sigma R$.

In summary, the inductor value L is determined by first running the inner loop of the voltage (boost) converter) 610 for given $I_{PEAK}=k \cdot V_{IN}$. While steady-state is obtained, the control logic 632 toggles the switch 634 until the comparator 636 determines that the scaled input voltage $V_A$ is equal to the difference voltage $V_{DIFF}$ of the differential inverting amplifier 638. The identification is stopped, and the inductor value L is known from the position of the switch 634.

The value of the reference peak inductor current $I_{PEAK}$ should be chosen so that, for the lowest possible ripple (i.e., inductor value L is maximum and the input voltage $V_{IN}$ is a minimum), the duty-cycle remains below 0.5. This condition avoids the inner-loop feedback requiring ramp-compensation.

Figure 7:
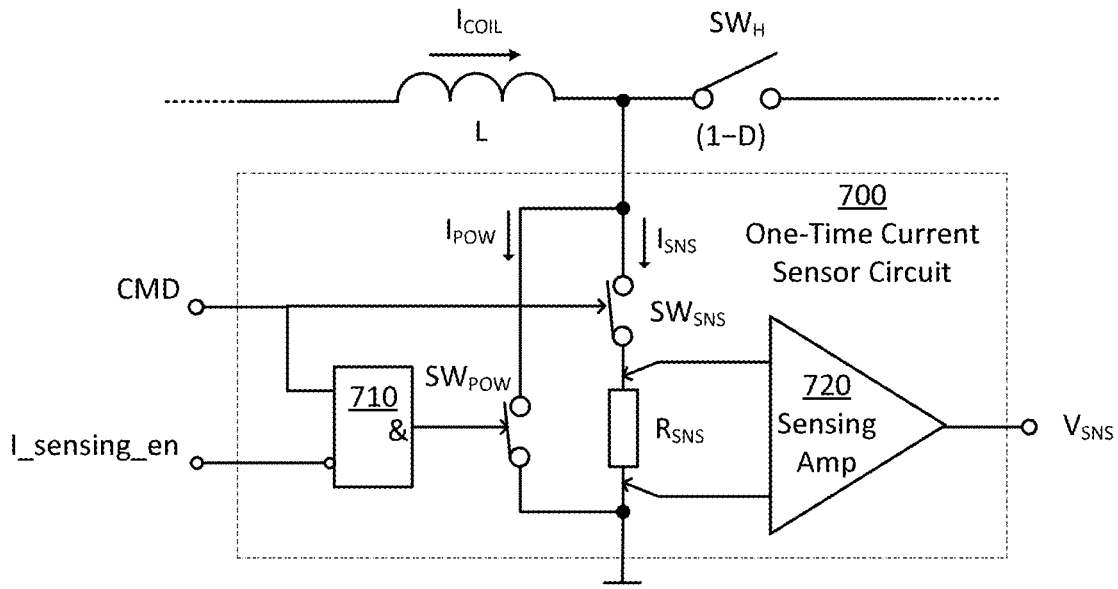
FIG. 7 illustrates a one-time current sensor circuit in accordance with the disclosure.

FIG. 7 illustrates a one-time usage current sensor circuit 700 in accordance with the disclosure.

The inner loop of the controller 110/410/610 may include the one-time current sensor circuit 700, which is a high-accuracy current sensing circuit used during start-up only for the purpose of the inductor value determination.

The one-time current sensor circuit 700 comprises a sense element $R_{SNS}$, sensing amplifier 720, a dedicated inductor current sensor switch $SW_{SNS}$, a power-on switch $SW_{POW}$, and a flip-flop circuit 710.

The sense element $R_{SNS}$ has a higher resistance than switches of the power converter 110/410/610, and is configured to measure the inductor current $I_{COIL}$. The sense element $R_{SNS}$ may be a resistor, transistor, or the like. The power converter switches may be main power switches. The measured inductor current $I_{COIL}$ is amplified by the sensing amplifier 720 to output the sense voltage $V_{SNS}$.

The dedicated inductor current sensor switch $SW_{SNS}$ and the power-on switch $SW_{POW}$ are configured to enable the current sensor circuit 700 during startup of the power converter 110/410/610, and bypass the current sensor circuit 700 during normal operation. The switches $SW_{SNS}$, $SW_{POW}$ are controlled by, for example, AND-gate circuit 710, which is enabled by a current sensing enable signal I_sensing_en. While only the sensing switch $SW_{SNS}$ is enabled during calibration (I_sensing_en=H), both switches $SW_{SNS}$, $SW_{POW}$ are toggled during normal operation. The on-resistance of the sensing path can be, for example, 10-100 times larger than the on-resistance of main switch $SW_{POW}$.

A current sensor is needed for inductor value determination. But since the inductor value is determined with low current ($I_{COIL}$=0) during startup, the current sensor circuit 700 can be built for low inductor current $I_{COIL}$ with a high-resistance sense element $R_{SNS}$. Efficiency of the DC/DC converter during calibration is not an issue.

Figure 8:
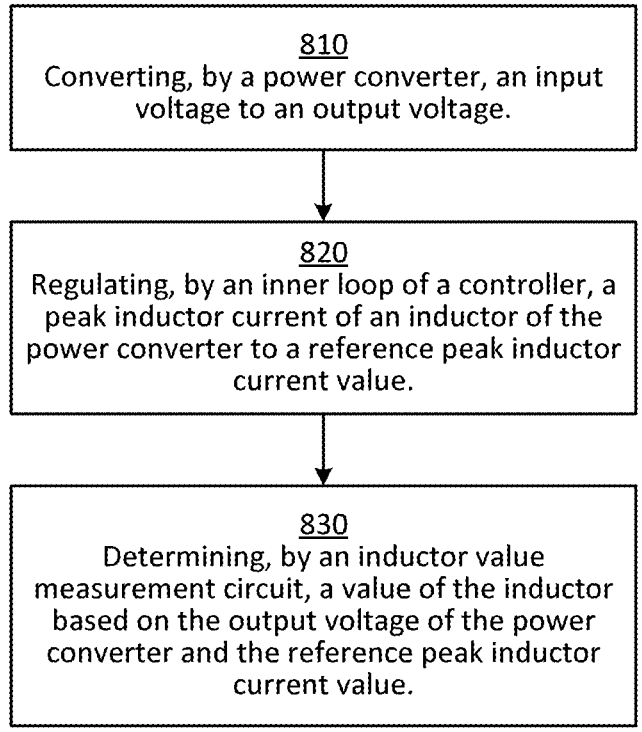
FIG. 8 illustrates a flowchart of a method in accordance with the disclosure.

FIG. 8 illustrates a flowchart of a method 800 in accordance with the disclosure.

At Step 810, a power converter 110/410/610 converts an input voltage $V_{IN}$ to an output voltage $V_{OUT}$.

At Step 820, an inner loop of a controller 120/420/620 regulates a peak inductor current of an inductor L of the power converter 110/41/610 to a reference peak inductor current value $I_{PEAK}$.

At Step 830, an inductor value measurement circuit 130/430/630 determines a value of the inductor L based on the output voltage $V_{OUT}$ of the power converter 110/410/610 and the reference peak inductor current value $I_{PEAK}$.

The inductor value determination as described herein improves controller accuracy. An accurate inductor value is required for controlling inductor peak current $I_{PEAK}$. By determining the inductor value L, full controller performance is enabled without an expensive and energy-inefficient current sensor (sense Field Effect Transistor (FET) or sense resistor), and without a fast analog-to-digital convertor in a current-sensing path. Moreover, even if the current sensing is required, digital control often requires the inductance value L in order to properly exploit loop full performance. Alternatively, if current sensing is not required, the inductor current information can be reconstructed digitally, knowing that the accurate inductor value determination disclosed herein dramatically improves the current estimator performance.

The techniques of this disclosure may also be described in the following examples.

Example 1

A circuit, comprising: a power converter configured to convert an input voltage to an output voltage; a controller having an inner loop configured to regulate a peak inductor current of an inductor of the power converter to a reference peak inductor current value; and an inductor value measurement circuit configured to determine a value of the inductor based on the output voltage of the power converter and the reference peak inductor current value.

Example 2

The circuit of example 1, wherein the reference peak inductor current value is dependent on the input voltage.

Example 3

The circuit of any combination of examples 1-2, wherein the inductor value is determined additionally based on the input voltage.

Example 4

The circuit of any combination of examples 1-3, wherein the inductor value measurement circuit is configured to determine the inductor value when a load coupled to the power converter is disabled.

Example 5

The circuit of any combination of examples 1-4, wherein the inductor value measurement circuit is configured to determine the inductor value during startup of the power converter.

Example 6

The circuit of any combination of examples 1-5, wherein the inductor value measurement circuit is configured to determine the inductor value when a load coupled to the power converter is sufficiency low to have an insignificant impact on the determination of the inductor value.

Example 7

The circuit of any combination of examples 1-6, wherein the inductor value measurement circuit comprises an analog-to-digital converter and a digital circuit configured to determine the inductor value.

Example 8

The circuit of any combination of examples 1-7, wherein the inductor value measurement circuit is an analog inductor value measurement circuit.

Example 9

The circuit of any combination of examples 1-8, wherein the inductor value measurement circuit is a digital inductor value measurement circuit.

Example 10

The circuit of any combination of examples 1-9, wherein the inner loop includes a current sensor circuit comprising: a sense element having a higher resistance than switches of the power converter, and configured to measure current of the inductor; and a dedicated inductor current sensor switch configured to enable the current sensor circuit during startup of the power converter, and bypass the current sensor circuit during normal operation.

Example 11

The circuit of any combination of examples 1-10, wherein the power converter is a boost converter.

Example 12

The circuit of any combination of examples 1-11, wherein the power converter is a buck converter.

Example 13

The circuit of any combination of examples 1-12, wherein the power converter is a buck-boost converter.

Example 14

A current sensor circuit of a controller inner loop configured to regulate a peak inductor current of an inductor of a power converter to a reference peak inductor current value, the current sensor circuit comprising: a sense element having a higher resistance than switches of the power converter, and configured to measure current of an inductor of the power converter; and a dedicated inductor current sensor switch configured to enable the current sensor circuit during startup of the power converter, and bypass the current sensor circuit during normal operation.

Example 15

A method, comprising: converting, by a power converter, an input voltage to an output voltage; regulating, by an inner loop of a controller, a peak inductor current of an inductor of the power converter to a reference peak inductor current value; and determining, by an inductor value measurement circuit, a value of the inductor based on the output voltage of the power converter and the reference peak inductor current value.

Example 16

The method of example 15, wherein the reference peak inductor current value is dependent on the input voltage.

Example 17

The method of any combination of examples 15-16, wherein the determining comprises determining the inductor value based on the input voltage.

Example 18

The method of any combination of examples 15-17, wherein the determining is performed when a load coupled to the power converter is disabled.

Example 19

The method of any combination of examples 15-18, wherein the determining is performed during startup of the power converter.

Example 20

The method of any combination of examples 15-19, wherein the inner loop has a current sensor circuit, and the regulating comprises: measuring, by a sense element having a higher resistance than switches of the power converter, current of the inductor; enabling, by a dedicated inductor current sensor switch, the current sensor circuit during startup of the power converter; and bypassing the current sensor circuit during normal operation.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A circuit, comprising:
a power converter configured to convert an input voltage to an output voltage;
a controller having an inner loop configured to regulate a peak inductor current of an inductor of the power converter to a reference peak inductor current value; and
an inductor value measurement circuit configured to determine an inductor value of the inductor based on the output voltage of the power converter and the reference peak inductor current value.

2. The circuit of claim 1, wherein the reference peak inductor current value is dependent on the input voltage.

3. The circuit of claim 1, wherein the inductor value is determined additionally based on the input voltage.

4. The circuit of claim 1, wherein the inductor value measurement circuit is configured to determine the inductor value when a load coupled to the power converter is disabled.

5. The circuit of claim 1, wherein the inductor value measurement circuit is configured to determine the inductor value during startup of the power converter.

6. The circuit of claim 1, wherein the inductor value measurement circuit is configured to determine the inductor value when a load coupled to the power converter is sufficiently low to have an insignificant impact on the determination of the inductor value.

7. The circuit of claim 1, wherein the inductor value measurement circuit comprises an analog-to-digital converter and a digital circuit configured to determine the inductor value.

8. The circuit of claim 1, wherein the inductor value measurement circuit is an analog inductor value measurement circuit.

9. The circuit of claim 1, wherein the inductor value measurement circuit is a digital inductor value measurement circuit.

10. The circuit of claim 1, wherein the inner loop includes a current sensor circuit comprising:
a sense element having a higher resistance than switches of the power converter, and configured to measure current of the inductor; and
a dedicated inductor current sensor switch configured to enable the current sensor circuit during startup of the power converter, and bypass the current sensor circuit during normal operation.

11. The circuit of claim 1, wherein the power converter is a boost converter.

12. The circuit of claim 1, wherein the power converter is a buck converter.

13. The circuit of claim 1, wherein the power converter is a buck-boost converter.

14. A current sensor circuit of a controller inner loop configured to regulate a peak inductor current of an inductor of a power converter to a reference peak inductor current value, the current sensor circuit comprising:
a sense element having a higher resistance than switches of the power converter, and configured to measure current of an inductor of the power converter; and
a dedicated inductor current sensor switch configured to enable the current sensor circuit during startup of the power converter, and bypass the current sensor circuit during normal operation.

15. A method, comprising:
converting, by a power converter, an input voltage to an output voltage;

regulating, by an inner loop of a controller, a peak inductor current of an inductor of the power converter to a reference peak inductor current value; and determining, by an inductor value measurement circuit, an inductor value of the inductor based on the output voltage of the power converter and the reference peak inductor current value.

16. The method of claim 15, wherein the reference peak inductor current value is dependent on the input voltage.

17. The method of claim 15, wherein the determining comprises determining the inductor value based on the input voltage.

18. The method of claim 15, wherein the determining is performed when a load coupled to the power converter is disabled.

19. The method of claim 15, wherein the determining is performed during startup of the power converter.

20. The method of claim 15, wherein the inner loop has a current sensor circuit, and the regulating comprises:

measuring, by a sense element having a higher resistance than switches of the power converter, current of the inductor;

enabling, by a dedicated inductor current sensor switch, the current sensor circuit during startup of the power converter; and bypassing the current sensor circuit during normal operation.

* * * * *